United States Patent
Hogyoku (10) Patent No.: US 6,835,982 B2
(45) Date of Patent: Dec. 28, 2004

(54) SEMICONDUCTOR DEVICES

(75) Inventor: Michiru Hogyoku, Nagano-ken (JP)

(73) Assignee: Seiko Epson Corporation, Tokyo (JP)

(*) Notice: Subject to any disclaimer, the term of this patent is extended or adjusted under 35 U.S.C. 154(b) by 28 days.

(21) Appl. No.: 10/183,888

(22) Filed: Jun. 27, 2002

(65) Prior Publication Data

US 2003/0025159 A1 Feb. 6, 2003

(30) Foreign Application Priority Data

Jun. 27, 2001 (JP) ........................................ 2001-194935

(51) Int. Cl.[7] ........................................ H01L 31/0392
(52) U.S. Cl. .................... 257/347; 257/395; 257/336; 257/344; 257/351; 257/296
(58) Field of Search ................................ 257/395, 347, 257/336, 344, 351, 296

(56) References Cited

U.S. PATENT DOCUMENTS

| | | | | |
|---|---|---|---|---|
| 4,965,213 A | * | 10/1990 | Blake ........................ | 438/154 |
| 6,020,222 A | * | 2/2000 | Wollesen .................... | 438/149 |
| 6,353,245 B1 | * | 3/2002 | Unnikrishnan .............. | 257/347 |
| 6,537,861 B1 | * | 3/2003 | Kroell et al. ................ | 438/149 |
| 6,583,001 B1 | | 6/2003 | Burr | |
| 6,586,817 B1 | | 7/2003 | Burr | |
| 6,596,554 B2 | * | 7/2003 | Unnikrishnan .............. | 438/180 |

OTHER PUBLICATIONS

A. Wei et al., *IEEE Trans. Electron Devices*, vol. 45, No. 2, pp. 430–438, (Feb. 1998).

L.M. Perron et al., *IEEE Trans. Electron Devices*, vol. 45, No. 11, pp. 2372–2375, (Nov. 1998).

H. Mikoshiba and M. Hogyoku, *Extended Abstracts of the 2000 Int'l Conf. on Solid State Devices and Mat'ls*, Sendai, pp. 464–465, (2000).

K. Mistry et al., *2000 Symposium on VLSI Technology Digest of Technical Papers*, pp. 204–205, (2000).

M. Horiuchi, *IEEE Trans. Electron Devices*, vol. 47, No. 8, pp. 1587–1592, (Aug. 2000).

* cited by examiner

*Primary Examiner*—Richard Elms
*Assistant Examiner*—Doug Menz
(74) *Attorney, Agent, or Firm*—Konrad Raynes & Victor, LLP; Alan S. Raynes

(57) ABSTRACT

A SOI MOSFET 10 may be formed from silicon single crystal as a substrate body that is formed on an embedded oxide film 11. For example, a P-type body 12, a channel section 13, and N-type source region 14 and drain region 15 are formed therein. Low concentration N-type extension regions 18, a gate electrode 17 provided through a gate dielectric layer 16 and sidewalls 19 are formed therein. A body terminal 101 in which a resistance (body resistance) Rb between itself and a body is positively increased is provided, and the body terminal 101 is connected to a source region 14. This structure realizes a SOI MOSFET with a BTS (Body-Tied-to-Source) operation accompanied by a transient capacitive coupling of a body during a circuit operation.

6 Claims, 5 Drawing Sheets

Fig. 1

Rb (Body-to-body terminal resistance (Body resistance))

SEMICONDUCTOR DEVICES

Applicant claims priority in and hereby incorporates by reference in its entirety Japanese Application No. 2001-194935 (P), filed Jun. 27, 2001.

TECHNICAL FIELD

The present invention relates to a transistor element that is formed in a SOI (Silicon On Insulator) film, and more particularly includes a semiconductor device that improves a current drivability of a partially depleted type element in which its body is partially depleted.

RELATED ART

A SOI MOSFET is a MOSFET structured in a silicon single crystal formed on an insulation film, and has an advantage in that its source-to-drain junction capacity is suppressed to a small amount. For this reason, it operates faster than a MOSFET manufactured on an ordinary bulk silicon substrate (i.e., a bulk MOSFT). Also, since it can operate at a high speed even with a low voltage power supply, its application to lower power consumption LSIs is being studied.

SOI MOSFETs are generally divided into two groups, fully depleted type SOI MOSFETs in which a body region in the silicon single crystal is fully depleted, and partially depleted type SOI MOSFETs in which a body region in the silicon single crystal is partially depleted. Embodiments of the present invention relate to partially depleted type SOI MOSFETs, and to technologies that improve their current drivability.

Figure 4:
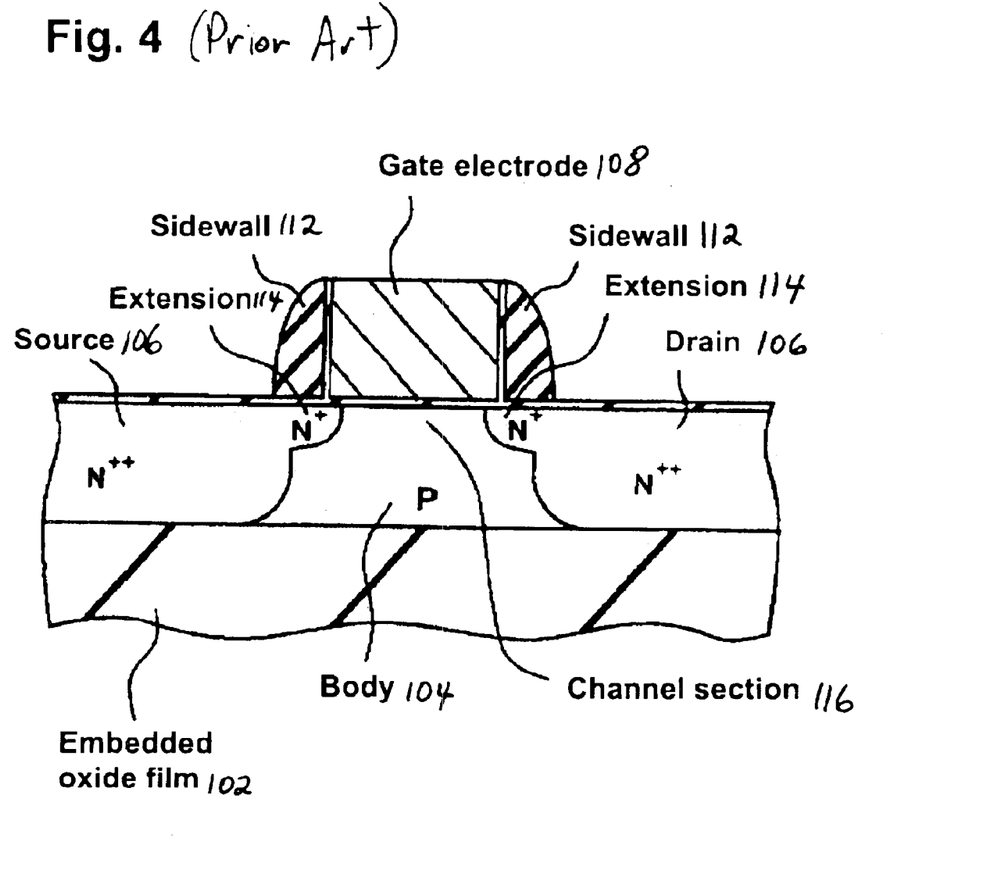
FIG. 4 shows a cross section of a structure of an ordinary SOI MOSFET.

FIG. 4 shows a cross section of a structure of an ordinary SOI MOSFET. A silicon single crystal 100 is formed on a $SiO_2$ film that is called an embedded oxide film 102, and a P-type body 104 and N-type source and drain regions 106, for example, are formed. A gate electrode 108 is formed over the body 104 through a gate oxide film 110. Sidewalls (spacers) 112, which are to be provided after N-type extension regions 114 having a lower concentration than that of the source and drain regions 106 are formed, are formed on both sides of the gate electrode 112. Channel section 116 is located below the gate electrode 108.

In the partially depleted type SOI MOSFET with an FB (Floating-Body) operation, the body is in an electrically floating state. By this, its current characteristic during a circuit operation is different from that in a steady state because of the following two reasons:

The first reason is a self-heat generation effect resulting from the low thermal conductivity of the embedded oxide film. In general, the self-heat generation effect during a circuit operation is weaker than the effect in a steady state, and therefore the actual current drivability during a circuit operation is higher than that estimated from DC measurement results. It is noted that this effect is universal to SOI devices, and can be seen in operation methods other than the FB (Floating-Body) operation method (for example, in a BTS (Body-Tied-to-Source) operation to be described below).

The second reason is a so-called substrate floating effect. While a body potential in a steady state is determined by a condition in which the sum of currents flowing out from the body becomes zero (0), a body potential in a circuit operation needs to be calculated in consideration of a transient capacitive coupling between each node of the source and drain and the body.

If a normal value of off current is considered, a body potential in a steady state at an off bias (a gate voltage Vgs=0, and a drain voltage Vds=VDD (power supply voltage)) becomes an issue. Also, when an effective current characteristic during a circuit operation is considered, a body potential in a transient state at that moment becomes an issue. In this connection, a parasitic bipolar operation caused by generation of carriers in a steady state, which is characteristic to SOI MOSFETs with an FB (Floating-Body) operation, will be described below.

In an ordinary bulk MOSFET, a substrate potential is fixed at a power supply line potential through a well contact. A substrate current that penetrates the well contact is a current caused by the generation of carriers (impact ionization current may have a contribution depending on the setting of the power supply voltage and off current) at a junction thereof, which is caused by a potential difference applied between the drain and the substrate.

However, a SOI MOSFET with an FB (Floating-Body) operation, a terminal that corresponds to a substrate is not provided in the body. As a result, a current by generated carriers at a junction section of the drain and the body positively bias the body.

In other words, the current by generated carriers at a junction section of the drain and the body plays a role of a base current, such that a bipolar operation parasitically occurs with the source, the drain and the body functioning as an emitter, a collector and a base, respectively.

The body is positively biased by the parasitic bipolar operation, and carrier recombination currents at the source-body junction section increase. Eventually, the body potential continues elevating until it balances with the current by generated carriers at the drain-body junction section. Therefore, a stationary value of the body potential is given by the following expression:

$$Ibs(Vbs)+Ibd(Vbd)=Idiode(Vbs)+Idiode(Vbs-Vds)=0 \quad \text{Equation (1)}$$

(where Ibs is a body-to-source current, Vbs is a body-to-source voltage, Ibd is a body-to-drain current, Vbd is a body-to-drain voltage, Idiode is a diode current including impact ionization current, and Vds is a drain-to-source current.)

By the above SOI MOSFET with an FB (Floating-Body) operation, an off current during a circuit operation standby period increases in association with the parasitic bipolar operation resulting from currents by generated carriers. As a result, the SOI MOSFET needs to increase its impurity concentration at the body (channel section) compared to a bulk MOSFET, and its carrier field effect mobility decreases accordingly.

SUMMARY

Certain embodiments of the present invention relate to a semiconductor device having a SOI MOSFET in which a MOSFET is formed in a silicon single crystal formed on a dielectric film. The semiconductor device may include a SOI MOSFET with a BTS (Body-Tied-to-Source) operation accompanied by a transient capacitive coupling of a body during a circuit operation, which is achieved by providing a body terminal in which a resistance between itself and the body in the silicon single crystal is positively increased, and connecting the body terminal to a source terminal.

Certain embodiments also relate to a semiconductor device having a SOI MOSFET in which a MOSFET is formed in a silicon single crystal formed on a dielectric film, the semiconductor device including a SOI MOSFET with a BTS (Body-Tied-to-Source) operation that satisfies three conditions as follows:

Condition 1, wherein a capacitive coupling occurs during a circuit operation:

$$Rb > Rrc,$$

wherein Rb is a body-to-body terminal resistance (body resistance), and Rrc is a resistance dependent on a circuit operation frequency.

Condition 2, wherein A body potential under a steady state becomes about zero at an off bias (in which a gate voltage Vgs=0, and a drain voltage Vds=VDD (power supply voltage)):

$$Vbs,\text{standby} = -[Idiode\ (Vbs,\text{standby}) + Idiode\ (Vbs,\text{standby}-VDD)] \times Rb \cong 0,$$

wherein Vbs,standby is a body potential in a steady state at an off bias, Idiode is a diode current including impact ionization current, VDD is a power supply voltage, and Rb is a body-to-body terminal resistance (body resistance).

Condition 3, wherein a current that penetrates a body terminal during a circuit operation is sufficiently larger than a current that flows upon generation and recombination of carriers:

$$|Ib| >> |Idiode|,$$

{wherein Ib is a penetration current at the body terminal, and Idiode is a diode current including impact ionization current.

Certain embodiments also relate to a semiconductor device having a SOI MOSFET in which a MOSFET is formed in a silicon single crystal formed on a dielectric film, the semiconductor device including a body lead-out section in which an impurity is introduced for leading out a terminal of a body in the silicon single crystal, a resistance factor section using a depletion phenomenon adjacent to a boundary between the impurity of the body lead-out section and the body, and a SOI MOSFET with a BTS (Body-Tied-to-Source) operation that satisfies three conditions as follows:

Condition 1, wherein a capacitive coupling occurs during a circuit operation:

$$Rb > Rrc,$$

wherein Rb is a body-to-body terminal resistance (body resistance), and Rrc is a resistance dependent on a circuit operation frequency.

Condition 2, wherein a body potential under a steady state becomes to be about zero at an off bias (in which a gate voltage Vgs=0, and a drain voltage Vds=VDD (power supply voltage)):

$$Vbs,\text{standby} = -[Idiode\ (Vbs,\text{standby}) + Idiode\ (Vbs,\text{standby}-VDD)] \times Rb \cong 0,$$

wherein Vbs,standby is a body potential in a steady state at an off bias, Idiode is a diode current including impact ionization current, VDD is a power supply voltage, and Rb is a body-to-body terminal resistance (body resistance).

Condition 3, wherein a current that penetrates a body terminal during a circuit operation is sufficiently larger than a current that flows upon generation and recombination of carriers:

$$|Ib| >> |Idiode|,$$

wherein Ib is a penetration current at the body terminal, and Idiode is a diode current including impact ionization current.

BRIEF DESCRIPTION OF THE DRAWINGS

Embodiments of the invention are described with reference to the accompanying drawings which, for illustrative purposes, are schematic and not necessarily drawn to scale.

FIGS. 2(a) and (b) each show a significant structure of a semiconductor device in accordance with a first embodiment of the present invention, wherein

FIGS. 3(a) and (b) each show a significant structure of a semiconductor device in accordance with a second embodiment of the present invention, wherein

DETAILED DESCRIPTION

In a SOI MOSFET with an FB (Floating-Body) operation, the off current during a circuit operation standby period increases by the parasitic bipolar operation resulting from currents by generated carriers. For this reason, the impurity concentration at the body (channel section) should be increased compared to that of a bulk MOSFET, its carrier field effect mobility decreases accordingly, and its current drivability lowers.

Certain embodiments of the present invention are made in view of the circumstances described above, and relate to a semiconductor device having a partially depleted type SOI MOSFET that further improves the current drivability.

First, an effective current characteristic of a partially depleted type SOI MOSFET with an FB (Floating-Body) operation during a circuit operation will be described.

A partially depleted type SOI MOSFET with an FB (Floating-Body) operation during a circuit operation has a body charge amount that is generally constant because each of the components of body currents that are a source to change the body charge is extremely small.

In other words, the body generates a transient capacitive coupling at each of the nodes between the gate, source and drain. A steady state during a circuit operation (which is different from an ordinary meaning) indicates a state in which the body charge amount does not change after one cycle of the circuit operation elapses, which is defined by the following expression:

$$Qb(t+Tp) - Qb(t) = 0 \qquad \text{Equation (2)}$$

where, Qb(t) represents a body charge amount at a specified time t, and tp means one cycle of the circuit operation. With respect to Equation (2), see Chapter III, Section C of a document "A. Wei et al., IEEE Trans. Electron Devices, vol. 45, pp.430–438, 1998," (hereafter referred to as "Document—1"). This document is hereby incorporated by reference in its entirety.

Equation (2) can be modified by using a diode current Idiode including impact ionization current to obtain the following expression:

$$\int^{t+tp}[Idiode(Vbs)+Idiode(Vbs-Vds)]dt'=0 \quad \text{Equation (3)}$$

where, the range of the integration on the left-hand side is from (t+tp) to t, Vbs and Vds are functions of time t', and positive or negative values to be integrated on the left-hand side mean recombination or generation of carriers at the body, respectively.

Accordingly, a physical meaning of the entire Equation (3) can be interpreted as "In a steady state during a circuit operation, the carrier generation that occurs when the body potential lowers due to capacitive coupling with a fall of the bias at the gate or the drain is compensated by the carrier recombination that occurs when the body potential elevates due to capacitive coupling with the increase in both of the biases during a current driving." In view of the carrier recombination that occurs during a current driving, there is little or no doubt that, at this instance, the transient body potential would overshoot.

In other words, Expression (3) is an equation that defines a steady state during a circuit operation, and at the same time is also an equation that proves the occurrence of overshooting of the transient body potential during a current driving. And therefore, due to the influence of the overshooting of the transient body potential, the transient threshold voltage and the transient saturation current would undershoot and overshoot, respectively. In other words, the current drivability would overshoot during a circuit operation.

Figure 5:
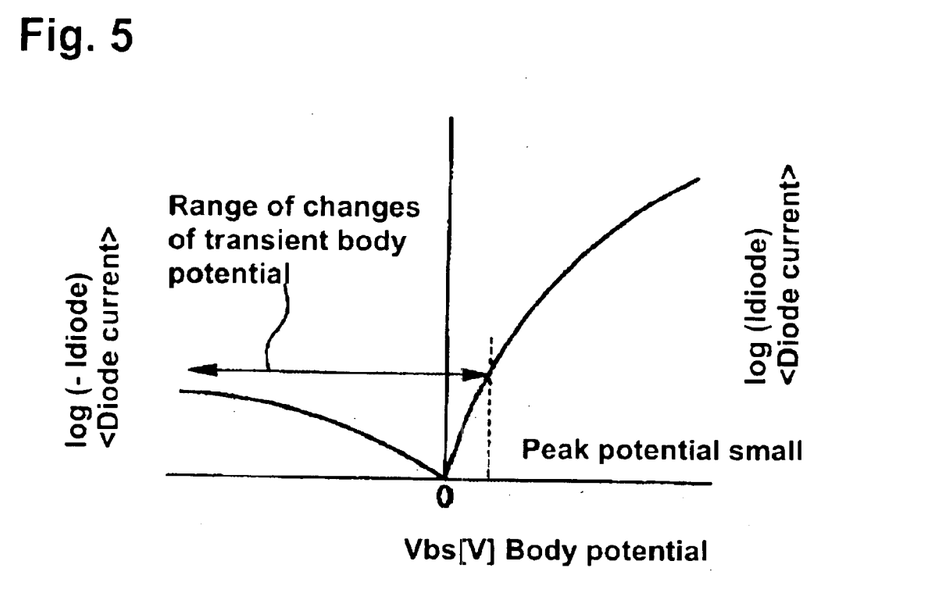
FIG. 5 shows a characteristic graph that indicates changes in the transient body potential during a circuit operation of a partially depleted type SOI MOSFET with an FB (Floating-Body) operation.

However, when the transient overshooting of the body potential and the current drivability is quantitatively calculated, attention should be given to the fact that the carrier recombination generally occurs faster than the carrier generation. In other words, to compensate the carrier generation that occurs with a fall of the bias, the carrier recombination that occurs with the overshooting of a small amount of the transient body potential during a current driving is sufficient. With respect to this characteristic, see a characteristic graph of FIG. 5 that indicates changes in the transient body potential during a circuit operation of a partially depleted type SOI MOSFET with an FB (Floating-Body) operation.

Furthermore, according to Chapter III of a document "L. M. Perron et al., IEEE Trans. Electron Devices, vol. 45, pp. 2372–2375, 1998," (hereafter referred to as "Document—2"), which is hereby incorporated by reference in its entirety, the bias diminishes and the time to generate carriers relatively shortens with an increase in the circuit operation frequency, the switching probability and the load capacitance, and there is a tendency that the overshooting of the transient body potential during a current driving gradually diminishes. In other words, the transient overshooting of the current drivability is not necessarily large, and diminishes with an increase in the circuit operation frequency, the switching probability and the load capacitance.

In view of the above description, attention may be paid to the fact that it is advantageous that the overshooting of transient body potential at a current driving during a circuit operation can be quantified whatever the degree thereof may be.

Figure 6:
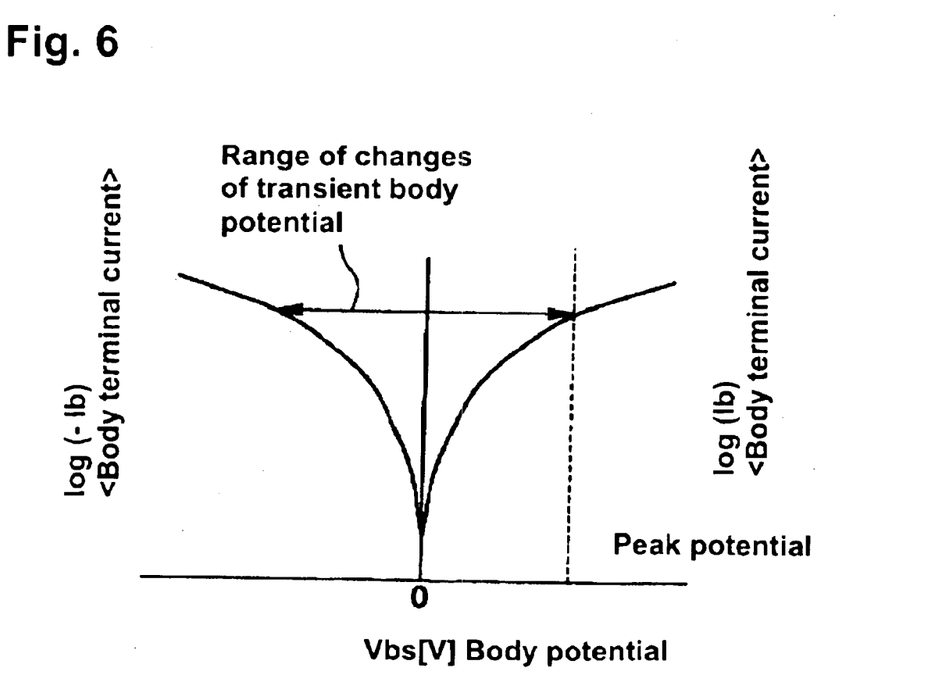
FIG. 6 shows a characteristic graph that indicates changes in the transient body potential during a circuit operation of a partially depleted type SOI MOSFET with a BTS (Body-Tied-to-Source) operation.

A document "H. Mikoshiba and M. Hogyoku, Ext. Abs. SSDM, pp. 464–465, 2000" (hereafter referred to as "Document—3"), in Chapter 3 and FIG. 6 shows an example of analysis and evaluation of the current drivability of partially depleted type SOI MOSFETs with an FB (Floating-Body) operation. This document is hereby incorporated by reference in its entirety.

As described earlier, the carrier field effect mobility decreases with the increase in channel impurity concentration that is required to adjust an increased off current that results from parasitic bipolar operations. Also, the transient body potential at the time of current driving in a circuit operation tends to overshoot.

Review of the document (Document—3) in consideration of these two effects reveals that a partially depleted type SOI MOSFET with an FB (Floating-Body) operation in effect remains in a state in which only a 7% increase in saturation current can be expected compared to a bulk MOSFET as a result of mutual compensation of influences of the disadvantage of the reduction in carrier field effect mobility occurring with the increase in channel impurity concentration described earlier and the advantage of the overshooting of the transient body potential described earlier.

It is noted that the measured values of delay time in CMOS inverters reported in a document "K. Mistry et al., VLSI Tech. Dig., pp.204–205, 2000" (hereafter referred to as "Document—4") and so forth also reveal that only a several % increase in the current drivability is expected. This document is hereby incorporated by reference in its entirety.

Accordingly, certain embodiments of the present invention provide a partially depleted type SOI MOSFET structure that suppresses the disadvantage indicated earlier that is characteristic in the FB (Floating-Body) operation, and amplifies the advantage described earlier, to thereby improve the current drivability thereof.

In order to suppress the disadvantage indicated earlier, a body needs to be provided with a terminal to fix its potential. (However, it is noted that an introduction that focuses on carrier recombination such as injection of Ar ions or the like is only effective in suppressing the parasitic bipolar operation that is caused by impact ionization.) On the other hand, if the body potential were completely fixed, the advantage described earlier would be lost.

To solve the problems described above, there is provided a partially depleted type SOI MOSFET having a body terminal configuration whereby the body potential during a circuit operation is controlled in a manner to accompany a capacitive coupling. In other words, the characteristic of RC line delay is utilized. When a potential change is applied to one end side of a line having a resistance and a capacitance, a potential change that propagates to the other end side is extremely small if the resistance of the line and a frequency of the applied potential change are sufficiently high.

In other words, even when a body terminal is provided, if a resistance between itself and the body and the circuit operation frequency are sufficiently high, an effective body potential during a circuit operation is not fixed at a potential on the terminal but rather changes while accompanying a capacitive coupling. This causes to receive the influence of the advantage due to the overshooting of the transient body potential.

In addition, if a body potential at an off bias (wherein a gate voltage Vgs=0, and a drain voltage Vds=VDD (power supply voltage)) at a lowest frequency limit of potential change, in other words, in a steady state, is fixed at about a source potential, the disadvantage of the reduction in carrier field effect mobility that occurs with the increase in channel impurity concentration would be suppressed.

To make a specific embodiment of the structure described above, a structure with a BTS (Body-Tied-to-Source) operation that operates through connecting a terminal of a body to that of a source would preferably be employed. By this structure, an advantage can be found.

In other words, even in a BTS (Body-Tied-to-Source) operation, when the resistance between a body terminal and a body and the circuit operation frequency are sufficiently high, the body potential during a circuit operation would change with a capacitive coupling. In this instance, if a current that penetrates the body terminal is sufficiently larger than a current caused by carrier generation and recombination, supplement and discharge of majority carriers of the body would be mainly governed by the penetration current at the body terminal.

Supplement and discharge of majority carriers in the body by the current that penetrates the body terminal connected to the source terminal occur at the same speed. Therefore, the problem resulting from the fact that carrier recombination occurs faster than carrier generation, in other words, the problem that "the transient overshooting of the body potential and the current drivability is not necessarily large, and diminishes with an increase in the circuit operation frequency, the switching probability and the load capacitance," would be eventually suppressed. With respect to certain embodiments of the present invention, FIG. 6 shows a characteristic graph indicating changes in the transient body potential during a circuit operation.

In view of the above, in certain embodiments, to provide a partially depleted type SOI MOSFET with a structure that further improves the current drivability, it is important to increase the resistance value of a body contact to a certain level. Such a structure may be provided in the following manner:

[1] A semiconductor device in accordance with an embodiment of the present invention pertains to a SOI MOSFET in which a MOSFET is formed in a silicon single crystal formed on a dielectric film, and is characterized in comprising:

a SOI MOSFET with a BTS (Body-Tied-to-Source) operation accompanied by a transient capacitive coupling of a body during a circuit operation, which is achieved by providing a body terminal in which a resistance between itself and the body in the silicon single crystal is positively increased, and connecting the body terminal to a source terminal.

[2] Furthermore, a semiconductor device in accordance with the present embodiment pertains to a SOI MOSFET in which a MOSFET is formed in a silicon single crystal formed on a dielectric film, and is characterized in comprising:

a SOI MOSFET with a BTS (Body-Tied-to-Source) operation that satisfies three conditions as follows:

Condition 1: A capacitive coupling occurs during a circuit operation:

$Rb > Rrc$,

{where Rb is a body-to-body terminal resistance (body resistance), and Rrc is a resistance dependent on a circuit operation frequency};

Condition 2: A body potential under a steady state becomes to be about zero at an off bias (in which a gate voltage Vgs=0, and a drain voltage Vds=VDD (power supply voltage)):

$Vbs,\text{standby} = -[Idiode(Vbs,\text{standby}) + Idiode(Vbs,\text{standby} - VDD)] \times Rb \approx 0$, {where Vbs,standby is a body potential in a steady state at an off bias, Idiode is a diode current including impact ionization current, VDD is a power supply voltage, and Rb is a body-to-body terminal resistance (body resistance)}; and Condition 3: A current that penetrates a body terminal during a circuit operation is sufficiently larger than a current that flows upon generation and recombination of carriers:

$|Ib| >> |Idiode|$,

{where Ib is a penetration current at the body terminal, and Idiode is a diode current including impact ionization current}.

[3] A semiconductor device in accordance with a preferred embodiment of the present invention pertains to a SOI MOSFET in which a MOSFET is formed in a silicon single crystal formed on a dielectric film, and is characterized in comprising:

a body lead-out section in which an impurity is introduced for leading out a terminal of a body in the silicon single crystal;

a resistance factor section using a depletion phenomenon adjacent to a boundary between the impurity of the body lead-out section and the body; and a SOI MOSFET with a BTS (Body-Tied-to-Source) operation that satisfies three conditions as follows:

Condition 1: A capacitive coupling occurs during a circuit operation:

$Rb > Rrc$,

{where Rb is a body-to-body terminal resistance (body resistance), and Rrc is a resistance dependent on a circuit operation frequency};

Condition 2: A body potential under a steady state becomes to be about zero at an off bias (in which a gate voltage Vgs=0, and a drain voltage Vds=VDD (power supply voltage)):

$Vbs,\text{standby} = -[Idiode(Vbs,\text{standby}) + Idiode(Vbs,\text{standby} - VDD)] \times Rb \approx 0$, {where Vbs,standby is a body potential in a steady state at an off bias, Idiode is a diode current including impact ionization current, VDD is a power supply voltage, and Rb is a body-to-body terminal resistance (body resistance)}; and Condition 3: A current that penetrates a body terminal during a circuit operation is sufficiently larger than a current that flows upon generation and recombination of carriers:

$|Ib| >> |Idiode|$,

{where Ib is a penetration current at the body terminal, and Idiode is a diode current including impact ionization current}.

[4] Also, in the semiconductor device set forth in [3], the SOI MOSFET is equipped with an extension region in the silicon single crystal adjacent to a gate electrode, the extension region having a junction depth smaller than a thickness of the body, and a depletion layer of the body immediately below the extension region defines the resistance factor section.

[5] Also, in the semiconductor device set forth in [3], the SOI MOSFET is equipped with an extension region in the silicon single crystal, the extension region having a junction depth smaller than a thickness of the body, and a depletion layer of the body immediately below the extension region defines the resistance factor section.

Figure 1:
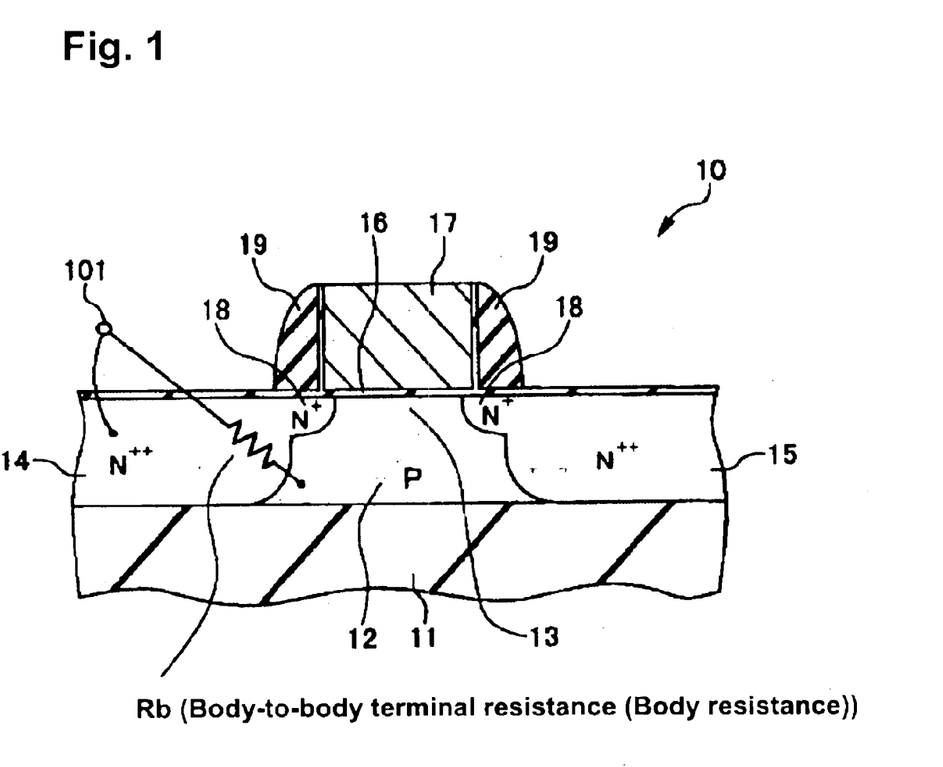
FIG. 1 shows a significant structure of a semiconductor device in accordance with a basic embodiment of the present invention, which shows a cross-sectional view of a key portion of a partially depleted type SOI MOSFET with a BTS (Body-Tied-to-Source) operation.

FIG. 1 shows a structure of a semiconductor device in accordance with a basic general embodiment of the present invention, which shows a cross-sectional view of a key portion of a partially depleted type SOI MOSFET with a BTS (Body-Tied-to-Source) operation.

A SOI MOSFET 10 is formed from silicon single crystal as a substrate body that is formed on an embedded oxide film 11. For example, a P-type body 12, a channel section 13, and N-type source region 14 and drain region 15 are formed. A gate electrode 17 is formed over the channel section 13 through a gate dielectric layer 16. Sidewalls (spacers) 19, which are to be provided after extension regions 18 that define low concentration N-type regions are formed, are formed on both sides of the gate electrode 17.

In this embodiment, a body terminal 101 in which a resistance (body resistance) Rb between itself and body 12 is positively increased is provided, and the body terminal 101 is electrically connected to the source region 14. This structure realizes a SOI MOSFET with a BTS (Body-Tied-to-Source) operation accompanied by a transient capacitive coupling of the body 12.

In accordance with aspects of certain embodiments of the present invention, attention should be paid to the following points when determining a value of the body resistance Rb. It should be increased to a high level so that a transient capacitive coupling of the body occurs during a circuit operation (Point 1). It should be lowered to a level that can control the amount of majority carriers of the body in that capacitive coupling state (Point 2). Also, it should be lowered to a level that can avoid an increase in the off current during a circuit operation standby state, which may result from impact ionization or a process of generation of carriers such as generation of Shockley-Read-Hall (SRH) carriers or the like (Point 3).

With respect to Point 1, a phenomenon in which the control of body potential becomes impossible with the increase in resistance of the body or the body terminal is generally known, and this can be used.

With respect to Point 2, it is generally known that the amount of majority carriers of the body, as it is considered during a circuit operation with an FB (Floating-Body) operation, minutely fluctuates about a constant value that is determined by a bias hysteresis during the circuit operation as well as a speed ratio between the processes of carrier generation and recombination (see Chapter III, Section C of the document (Document—1)). This phenomenon is equivalent to the fact that the body connects to each section of the gate/source/drain/substrate through a capacitive coupling (see Chapter I of the document (Document—1), which is hereby incorporated by reference in its entirety).

Also, the speed of carrier generation occurring at the P-N junction is small compared to the speed of carrier recombination. Therefore, the amount of majority carriers of the body in the capacitive coupling state in a circuit operation, and the effective current drivability affected by the same are believed to diminish with the increase in the circuit operation frequency and load capacitance (see Chapter III of the document (Document—2)).

In contrast, in the present embodiment of the present invention, the factor that controls the amount of majority carriers of the body in a circuit operation, which may be the carrier generation and recombination current that is generated at the P-N junction, is replaced by the current that penetrates the body terminal. Since supplement and discharge of majority carriers of the body by the current that penetrates the body terminal connected to the source terminal occur at the same speed, it is believed that the dependency of the circuit operation frequency and the load capacitance is suppressed.

Also, in the BTS (Body-Tied-to-Source) operation that satisfies the condition relating to Point 3, an increase in the off current during a circuit operation standby state, which may result from impact ionization or a process of generation of carriers such as generation of Shockley-Read-Hall (SRH) carriers or the like, is not observed. Therefore, attention should be paid to the fact that the impurity concentration of the body (channel section) does not need to be set at a high level compared to a conventional bulk MOSFET.

In view of the above, the SOI MOSFET 10 is characterized to be a SOI MOSFET with a BTS (Body-Tied-to-Source) operation that satisfies the following three conditions:

Condition 1: A capacitive coupling occurs during a circuit operation:

$$Rb > Rrc,$$

{where Rb is a body-to-body terminal resistance (body resistance), and Rrc is a resistance dependent on a circuit operation frequency};

Condition 2: A body potential under a steady state becomes to be about zero at an off bias (in which a gate voltage Vgs=0, and a drain voltage Vds=VDD (power supply voltage)):

$$Vbs,\text{standby} = -[Idiode(Vbs,\text{standby}) + Idiode(Vbs,\text{standby}-VDD)] \times Rb \approx 0,$$

{where Vbs,standby is a body potential in a steady state at an off bias, Idiode is a diode current including impact ionization current, VDD is a power supply voltage, and Rb is a body-to-body terminal resistance (body resistance)}; and Condition 3: A current that penetrates a body terminal during a circuit operation is sufficiently larger than a current that flows upon generation and recombination of carriers:

$$|Ib| >> |Idiode|,$$

{where Ib is a penetration current at the body terminal, and Idiode is a diode current including impact ionization current}.

By the above composition, even when the body terminal 101 is provided, if a resistance between itself and the body 12 and the circuit operation frequency are both sufficiently high, an effective body potential during a circuit operation is not fixed at a potential on the body terminal 101 but rather changes while accompanying a capacitive coupling. By doing so, the influence of the advantage derived from the overshooting of transient body potential is received.

In addition, if a body potential at an off bias (wherein a gate voltage Vgs=0, and a drain voltage Vds=VDD (power supply voltage)) at a lowest frequency limit of potential change, in other words, in a steady state, is fixed at about a potential of the body terminal 101, the channel impurity concentration does not need to be increased, and the reduction in carrier field effect mobility can be suppressed. This further improves the current drivability.

Figure 2:
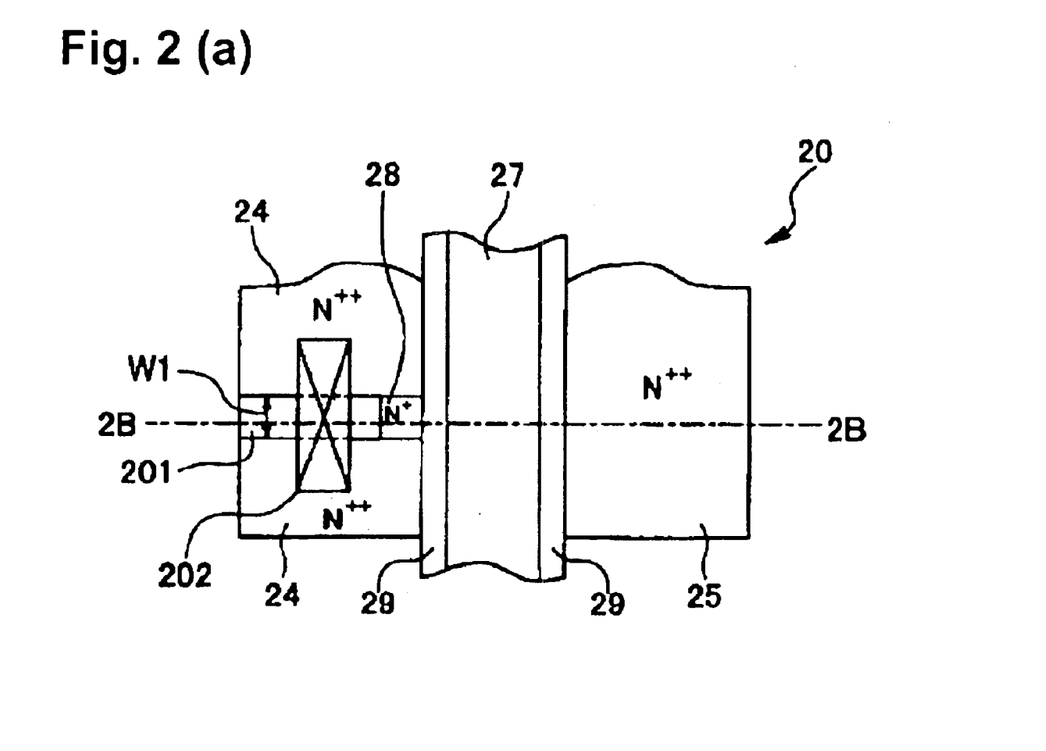
FIG. 2(a) is a plan view of a partially depleted type SOI MOSFET with a BTS (Body-Tied-to-Source) operation.
FIG. 2(b) is a cross-sectional view taken along a line 2B—2B of FIG. 2(a).

FIGS. 2(a) and (b) each show a significant structure of a semiconductor device in accordance with a first specific embodiment of the present invention, wherein FIG. 2(a) is a plan view of a partially depleted type SOI MOSFET with a BTS (Body-Tied-to-Source) operation, and FIG. 2(b) is a cross-sectional view taken along a line 2B—2B of FIG. 2(a).

A SOI MOSFET 20 is formed from silicon single crystal as a substrate body that is formed on an embedded oxide film 21. For example, a P-type body 22, a channel section 23, an $N^{++}$-type (high concentration N-type) source region 24, and a drain region 25 are formed. A gate electrode 27 is formed over the channel section 23 through a gate dielectric layer 26. Sidewalls (spacers) 29, which are to be provided after $N^+$-type (low concentration N-type) extension regions 28 are formed, are formed on both sides of the gate electrode 27.

In this embodiment, a body lead-out section 201 in which a high concentration P-type impurity ($P^{++}$) is introduced in a part of the source region 24 is provided for leading out a terminal of the body 22. The body lead-out section 201 has a contact 202 that is shared by the source and the body.

Also, the extension regions 28 is set such that its junction depth X1 is smaller than a thickness T1 of the body. By this, a depletion layer of the body immediately below the extension region 28 is provided as a resistance factor section using the depletion phenomenon adjacent to a boundary between the impurity of the body lead-out section 201 and the body 22.

Then, the following three conditions are satisfied.

Condition 1: A capacitive coupling occurs during a circuit operation:

$Rb > Rrc$,

{where Rb is a body-to-body terminal resistance (body resistance), and Rrc is a resistance dependent on a circuit operation frequency};

Condition 2: A body potential under a steady state becomes to be about zero at an off bias (in which a gate voltage Vgs=0, and a drain voltage Vds=VDD (power supply voltage)):

$Vbs,\text{standby} = -[Idiode(Vbs,\text{standby}) + Idiode(Vbs,\text{standby}-VDD)] \times Rb \approx 0$, {where Vbs,standby is a body potential in a steady state at an off bias, Idiode is a diode current including impact ionization current, VDD is a power supply voltage, and Rb is a body-to-body terminal resistance (body resistance)}; and Condition 3: A current that penetrates a body terminal during a circuit operation is sufficiently larger than a current that flows upon generation and recombination of carriers:

$|Ib| >> |Idiode|$,

{where Ib is a penetration current at the body terminal, and Idiode is a diode current including impact ionization current}.

In the structure described above, the extension region 28 is provided adjacent to the body lead-out section 201. By intentionally providing the extension region 28, and by adjusting the junction depth X1 of the extension region 28 and the thickness T1 of the body 22, a portion of the body immediately below the extension region 28 is depleted.

Furthermore, by adjusting the offset length L1 of the body lead-out section 201, the resistance between the body lead-out section 201 and the body 22 (body resistance) Rb can be set to a relatively high value (for example, about 100 MΩ–1 GΩ).

In other words, even when the body lead-out section 201 is provided, if the resistance (body resistance) Rb between itself and the body 22 and the circuit operation frequency are both sufficiently high, an effective body potential during a circuit operation will not be fixed at a potential on the body lead-out section 201 but rather changes while accompanying a capacitive coupling. By doing so, the influence of the advantage derived from the overshooting of transient body potential is received.

In addition, if a body potential at an off bias (wherein a gate voltage Vgs=0, and a drain voltage Vds=VDD (power supply voltage)) at a lowest frequency limit of potential change, in other words, in a steady state, is fixed at about a potential of the body lead-out section 201, the channel impurity concentration does not need to be increased, and the reduction in carrier field effect mobility can be suppressed. This further improves the current drivability.

By the embodiment described above, an increase in device area by the provision of a structure of the body contact (introduction of the body lead-out section 201) is suppressed to a minimum value.

This is because the role the extension region 28 plays is not only to elevate the body-to-body terminal resistance (body resistance) Rb by depleting the body immediately below, and also to minimize the reduction in effective channel width, which occurs with an introduction of the body lead-out section 201.

Also, there would not be a problem if the contact resistance of the body lead-out section 201 is relatively high. However, the contact of this section 201 preferably should not be formed with a Schottky junction. In view of further minimizing an increase in the element area, the design rule may preferably be provided with exceptions to reduce the width W1 of the body lead-out section 201 as small as possible.

It is noted that the body lead-out section 201 may be lead out from another section such as an end of the source region 24, without being limited to the embodiment described above. A plurality of such sections can be lead out onto the source region 24. Also, for introducing a resistance factor section using the depletion phenomenon adjacent to a boundary between the body lead-out section 201 and the body 22, other structures are also possible.

Figure 3:
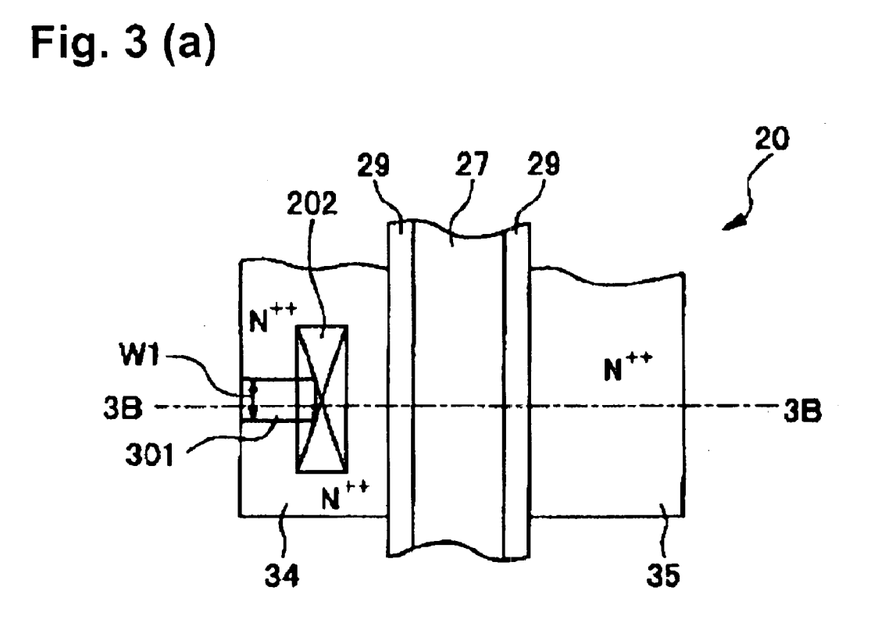
FIG. 3(a) is a plan view of a partially depleted type SOI MOSFET with a BTS (Body-Tied-to-Source) operation.
FIG. 3(b) is a cross-sectional view taken along a line 3B—3B of FIG. 3(a).

FIGS. 3(a) and (b) each show a significant structure of a semiconductor device in accordance with a second specific embodiment of the present invention, wherein FIG. 3(a) is a plan view of a partially depleted type SOI MOSFET with a BTS (Body-Tied-to-Source) operation, and FIG. 3(b) is a cross-sectional view taken along a line 3B—3B of FIG. 3(a). Components similar to those of the first specific embodiment are indicated by the same reference numbers.

In this embodiment, a body lead-out section 301 in which a high concentration P-type impurity ($P^{++}$) is introduced in a part of the source region 34 is provided for leading out a terminal of the body 22. The body lead-out section 301 has a contact 202 that is shared by the source and the body.

Also, the junction depth X2 of the source and drain regions 34 and 35 is set to be smaller than a thickness T1 of the body. As a result, a depletion layer of the body immediately below the source region 34 is provided as a resistance factor section using the depletion phenomenon adjacent to a boundary between the impurity of the body lead-out section 301 and the body 22.

With this structure, the following three conditions are satisfied.

Condition 1: A capacitive coupling occurs during a circuit operation:

$Rb > Rrc$,

{where Rb is a body-to-body terminal resistance (body resistance), and Rrc is a resistance dependent on a circuit operation frequency};

Condition 2: A body potential under a steady state becomes to be about zero at an off bias (in which a gate voltage Vgs=0, and a drain voltage Vds=VDD (power supply voltage)):

$Vbs,\text{standby}=-[Idiode(Vbs,\text{standby})+Idiode(Vbs,\text{standby}-VDD)]\times Rb\cong 0,$ {where Vbs,standby is a body potential in a steady state at an off bias, Idiode is a diode current including impact ionization current, VDD is a power supply voltage, and Rb is a body-to-body terminal resistance (body resistance)}; and Condition 3: A current that penetrates a body terminal during a circuit operation is sufficiently larger than a current that flows upon generation and recombination of carriers:

$|Ib|>>|Idiode|,$

{where Ib is a penetration current at the body terminal, and Idiode is a diode current including impact ionization current}.

In the structure described above, the source region 34 is provided adjacent to the body lead-out section 301. By intentionally providing the source region 34, and by adjusting the junction depth X2 of the region 34 and the thickness T1 of the body 22, a portion of the body immediately below the source region 34 is depleted.

Furthermore, by adjusting the offset length L1 of the body lead-out section 301, the resistance between the body lead-out section 301 and the body 22 (body resistance) Rb can be set to a relatively high value (for example, about 100 MΩ–1 GΩ).

In other words, even when the body lead-out section 301 is provided, if the resistance (body resistance) Rb between itself and the body 22 and the circuit operation frequency are both sufficiently high, an effective body potential during a circuit operation will not be fixed at a potential on the body lead-out section 301 but rather changes while accompanying a capacitive coupling. By doing so, the influence of the advantage derived from the overshooting of the transient body potential is received.

In addition, if a body potential at an off bias (wherein a gate voltage Vgs=0, and a drain voltage Vds=VDD (power supply voltage)) at a lowest frequency limit of potential change, in other words, in a steady state, is fixed at about a potential of the body lead-out section 301, the channel impurity concentration does not need to be increased, and the reduction in carrier field effect mobility can be suppressed. This further improves the current drivability.

By the embodiment described above, the body lead-out section 301 is introduced while a part of the source region is left on a side adjacent to the gate electrode. For this reason, the reduction in effective channel width that occurs with an introduction of the body lead-out section 301 is suppressed sufficiently and even better than the first embodiment. By this, it is expected that an increase in device area be also sufficiently suppressed to a minimum value.

Also, there would not be a problem if the contact resistance of the body lead-out section 301 is relatively high. However, the contact of this section 301 should not be formed with a Schottky junction. This is a very important difference, when compared with an embodiment described in Chapter II of a document "M. Horiuchi, IEEE Trans. Electron Devices, vol. 47, pp.1587–1592, 2000" (which is hereby incorporated by reference in its entirety), which has some similarity to certain aspects of the second embodiment of the present invention.

It is noted that the body lead-out section 301 may be lead out from another section such as an end of the source region 34, without being limited to the embodiment described above. A plurality of such sections can be lead out onto the source region 34.

As described above, in accordance with certain embodiments of the present invention, even in a BTS (Body-Tied-to-Source) operation that is conducted with a terminal of a body being connected to that of a source, if a body-to-body terminal resistance and a circuit operation frequency are both sufficiently high, a body potential during a circuit operation changes while accompanying a capacitive coupling. In this instance, if a current that penetrates the body terminal is sufficiently larger than a current caused by carrier generation and recombination, supplement and discharge of majority carriers of the body would be mainly governed by the penetration current at the body terminal. Since supplement and discharge of majority carriers in the body by the current that penetrates the body terminal connected to the source terminal occur at the same speed, it is believed that the problem resulting from the fact that the current drivability lowers with an increase in the circuit operation frequency and the load capacitance is suppressed. In addition, if a body potential at an off bias (wherein a gate voltage Vgs=0, and a drain voltage Vds=VDD (power supply voltage)) at a lowest frequency limit of potential change, in other words, in a steady state, is fixed at about a source potential, the channel impurity concentration does not need to be increased, and the reduction in carrier field effect mobility can be suppressed. As a result, a semiconductor device having a partially depleted type SOI MOSFET in which its current drivability is further improved can be provided.

In addition, it will be understood that a variety of modifications may be made to the embodiments described above within the scope of the present invention.

What is claimed:

1. A semiconductor device having a SOI MOSFET in which a MOSFET is formed in a silicon single crystal formed on a dielectric film, the semiconductor device comprising:

a SOI MOSFET including means for performing a BTS (Body-Tied-to-Source) operation that satisfies three conditions as follows:

Condition 1: A capacitive coupling occurs during a circuit operation:

$Rb>Rrc,$

{wherein Rb is a body-to-body terminal resistance (body resistance), and Rrc is a resistance dependent on a circuit operation frequency};

Condition 2: A body potential under a steady state becomes about zero at an off bias (in which a gate voltage Vgs=0, and a drain voltage Vds=VDD (power supply voltage)):

$Vbs,\text{standby}=-[Idiode\ (Vbs,\text{standby})+Idiode\ (Vbs,\text{standby}-VDD)]\times Rb\cong 0,$ {wherein Vbs,standby is a body potential in a steady state at an off bias, Idiode is a diode current including impact ionization current, VDD is a power supply voltage, and Rb is a body-to-body terminal resistance (body resistance)}; and Condition 3: A current that penetrates a body terminal during a circuit operation is sufficiently larger than a current that flows upon generation and recombination of carriers:

$$|Ib|>>|Idiode|,$$

{wherein Ib is a penetration current at the body terminal, and Idiode is a diode current including impact ionization current}.

2. A semiconductor device having a SOI MOSFET in which a MOSFET is formed in a silicon single crystal formed on a dielectric film, the semiconductor device comprising:

a body lead-out section in which an impurity is introduced for leading out a terminal of a body in the silicon single crystal;

a resistance factor section using a depletion phenomenon adjacent to a boundary between the impurity of the body lead-out section and the body; and a SOI MOSFET including means for performing a BTS (Body-Tied-to-Source) operation that satisfies three conditions as follows:

Condition 1: A capacitive coupling occurs during a circuit operation:

$$Rb>Rrc,$$

{wherein Rb is a body-to-body terminal resistance (body resistance), and Rrc is a resistance dependent on a circuit operation frequency};

Condition 2: A body potential under a steady state becomes about zero at an off bias (in which a gate voltage Vgs=0, and a drain voltage Vds=VDD (power supply voltage)):

$$Vbs,standby=-[Idiode\ (Vbs,standby)+Idiode\ (Vbs,standby-VDD)]\times Rb\approx 0,$$

{wherein Vbs,standby is a body potential in a steady state at an off bias, Idiode is a diode current including impact ionization current, VDD is a power supply voltage, and Rb is a body-to-body terminal resistance (body resistance)}; and Condition 3: A current that penetrates a body terminal during a circuit operation is sufficiently larger than a current that flows upon generation and recombination of carriers:

$$|Ib|>>|Idiode|,$$

{wherein Ib is a penetration current at the body terminal, and Idiode is a diode current including impact ionization current}.

3. A semiconductor device according to claim 2, wherein the SOI MOSFET is equipped with an extension region in the silicon single crystal adjacent to a gate electrode, the extension region having a junction depth smaller than a thickness of the body, and a depletion layer of the body immediately below the extension region defines the resistance factor section.

4. A semiconductor device according to claim 2, wherein the SOI MOSFET includes source and drain regions in the silicon single crystal, the source region having a junction depth smaller than a thickness of the body, and a depletion layer of the body immediately below the source region defines the resistance factor section.

5. A semiconductor device according to claim 4, wherein the body lead out section is positioned in a part of the source region.

6. A semiconductor device according to claim 5, wherein the drain region has a junction depth smaller than the thickness of the body.

* * * * *